US012772720B2

(12) United States Patent
Lee et al.

(10) Patent No.: US 12,772,720 B2
(45) Date of Patent: Oct. 20, 2026

(54) DISPLAY DEVICE AND METHOD OF MANUFACTURING THE SAME

(71) Applicant: Samsung Display Co., LTD., Yongin-si (KR)

(72) Inventors: Kyoung Won Lee, Yongin-si (KR); Eun Hye Ko, Yongin-si (KR); Yeon Hong Kim, Yongin-si (KR); Eun Hyun Kim, Yongin-si (KR); Sun Hee Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 513 days.

(21) Appl. No.: 18/343,231

(22) Filed: Jun. 28, 2023

(65) Prior Publication Data

US 2024/0040920 A1 Feb. 1, 2024

(30) Foreign Application Priority Data

Jul. 29, 2022 (KR) ........................ 10-2022-0094729

(51) Int. Cl.
*H10K 59/126* (2023.01)
*H10K 59/121* (2023.01)
(Continued)

(52) U.S. Cl.
CPC ......... *H10K 59/88* (2023.02); *H10K 59/1213* (2023.02); *H10K 59/126* (2023.02); *H10K 59/131* (2023.02)

(58) Field of Classification Search
CPC .. H10K 50/865; H10K 59/123; H10K 59/126; H10K 59/131; H10K 59/82;
(Continued)

(56) References Cited

U.S. PATENT DOCUMENTS 11,751,439 B2 * 9/2023 Kim ..................... H10D 86/423 257/40
12,075,665 B2 * 8/2024 Lee ........................ H10K 59/12
(Continued)

FOREIGN PATENT DOCUMENTS

JP 2797498 9/1998
JP 2003-7722 1/2003
(Continued)

OTHER PUBLICATIONS

KR 10208366 Machine Translation (Year: 2020).*
(Continued)

*Primary Examiner* — Eduardo A Rodela
(74) *Attorney, Agent, or Firm* — F. CHAU & ASSOCIATES, LLC

(57) ABSTRACT

A display device includes a light blocking layer positioned on a substrate and including a first portion and a second portion having a thickness greater than a thickness of the first portion; a buffer layer positioned above the light blocking layer; a semiconductor layer positioned over the buffer layer and including a source region, a channel region, and a drain region; a gate insulating layer positioned over the semiconductor layer; a gate electrode positioned over the gate insulating layer; an interlayer insulating layer positioned over the gate electrode, and including a first opening overlapping the second portion of the light blocking layer in a plan view and a second opening overlapping the source region of the semiconductor layer in a plan view; and a dummy gate electrode positioned on a side surface of the first opening.

9 Claims, 19 Drawing Sheets

(51) Int. Cl.
*H10K 59/131* (2023.01)
*H10K 59/88* (2023.01)

(58) Field of Classification Search
CPC ............... H10K 59/88; H10K 59/1201; H10K 59/1213; H10K 2102/351; H10K 71/00
See application file for complete search history.

(56) References Cited

U.S. PATENT DOCUMENTS

| | | | | |
|---|---|---|---|---|
| 2007/0032074 | A1* | 2/2007 | Kwak | H01L 21/76805 438/738 |
| 2015/0348999 | A1* | 12/2015 | Guo | H10D 30/6739 438/151 |
| 2022/0085131 | A1* | 3/2022 | Baek | H10K 59/123 |
| 2022/0173184 | A1* | 6/2022 | Jeong | H10K 59/1213 |

FOREIGN PATENT DOCUMENTS

| | | | | |
|---|---|---|---|---|
| JP | 2020-126250 | A | 8/2020 | |
| KR | 10208366 | B1 * | 2/2020 | H10K 50/805 |
| KR | 10-2022-0036416 | A | 3/2022 | |
| KR | 10-2022-0060622 | | 5/2022 | |

OTHER PUBLICATIONS

Chen et al., "Self-aligned top-gate InGaZnO thin film transistors using SiO2/Al2O3 stack gate dielectric", Thin Solid Films, Sep. 17, 2013, pp. 572-575, vol. 548.
Office Action dated Feb. 3, 2026 issued in corresponding Korean Patent Application No. 10-2022-0094729.

* cited by examiner

DISPLAY DEVICE AND METHOD OF MANUFACTURING THE SAME

CROSS-REFERENCE TO RELATED APPLICATION

This application claims priority to and benefits of Korean Patent Application No. 10-2022-0094729 under 35 U.S.C. § 119, filed in the Korean Intellectual Property Office on Jul. 29, 2022, the entire contents of which are incorporated herein by reference.

BACKGROUND

1. Technical Field

The disclosure relates to a display device and a method of manufacturing the same, which is capable of simplifying a manufacturing process thereof.

2. Description of the Related Art

The importance of display devices including thin film transistors has been emphasized because of the increasing developments of information technology. The thin film transistor is composed of a gate electrode, an active layer, a source electrode, and a drain electrode. The thin film transistor has a structure in which the active layer is positioned on the gate electrode or a structure in which the gate electrode is positioned on the active layer according to a structure in which the electrodes are disposed.

In case that the gate electrode is positioned on the active layer, the active layer is directly exposed to light inflowing from the bottom of the substrate. Accordingly, a light leakage current may occur in the active layer, and defects such as crosstalk may occur. To prevent this, a light shielding film may be provided under the active layer.

A plurality of mask processes are required in the process of forming the display device. It is desired that the display device is made with reduced number of mask processes to save time and money.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device manufactured in a simplified manufacturing process.

Embodiments also provide a method of manufacturing a display device, which is capable of simplifying a manufacturing process thereof.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment of the disclosure includes a light blocking layer positioned on a substrate and including a first portion and a second portion having a thickness greater than a thickness of the first portion; a buffer layer positioned above the light blocking layer; a semiconductor layer positioned over the buffer layer and including a source region, a channel region, and a drain region; a gate insulating layer positioned over the semiconductor layer; a gate electrode positioned over the gate insulating layer; an interlayer insulating layer positioned over the gate electrode, and including a first opening overlapping the second portion of the light blocking layer in a plan view and a second opening overlapping the source region of the semiconductor layer in a plan view; and a dummy gate electrode positioned on the side surface of the first opening.

The display device may further include a dummy gate insulating layer positioned on a side surface of the second opening and a dummy gate electrode positioned on the side surface of the second opening.

The interlayer insulating layer may further include a third opening overlapping the drain region of the semiconductor layer in a plan view. The display device may further include a dummy gate insulating layer positioned on a side surface of the third opening and a dummy gate electrode positioned on the side surface of the third opening.

The dummy gate electrodes and the gate electrode may be positioned on a same layer, and the dummy gate insulating layers and the gate insulating layer may be positioned on a same layer.

The semiconductor layer may overlap the first portion of the light blocking layer in a plan view.

An uppermost surface of the buffer layer positioned over the second portion of the light blocking layer may be positioned further from the substrate than an uppermost surface of the semiconductor layer.

The second portion of the light blocking layer may not overlap the gate insulating layer or a dummy gate insulating layer in a plan view.

The display device may further include a source electrode positioned on the interlayer insulating layer and a drain electrode positioned on the interlayer insulating layer. The source electrode may be in contact with the light blocking layer through the first opening, and in contact with the source region of the semiconductor layer through the second opening.

The drain electrode may be in contact with the drain region of the semiconductor layer through the third opening.

A method of manufacturing a display device according to an embodiment includes forming a light blocking layer on a substrate and including a first portion and a second portion having a thickness greater than a thickness of the first portion; forming a buffer layer on the light blocking layer; forming a semiconductor layer on the buffer layer and including a source region, a channel region, and a drain region; forming a gate insulating layer on the semiconductor layer; removing the gate insulating layer positioned on the second portion of the light blocking layer; forming a gate conductive layer on the gate insulating layer; and etching the gate insulating layer and the gate conductive layer. The etching of the gate insulating layer and the gate conductive layer includes forming at least one dummy gate electrode overlapping the second portion of the light blocking layer in a plan view, and forming a gate insulating layer and a gate electrode overlapping the channel region of the semiconductor layer in a plan view.

The forming of the gate conductive layer on the gate insulating layer may include directly contacting the buffer layer overlapping the second portion of the light blocking layer in a plan view with the gate conductive layer.

The at least one dummy gate electrode may include a plurality of dummy gate electrodes. The etching of the gate insulating layer and the gate conductive layer may include forming a dummy gate insulating layer and a dummy gate electrode of the plurality of dummy gate electrodes overlapping the source region of the semiconductor layer in a plan view, and forming a dummy gate insulating layer and a dummy gate electrode of the plurality of dummy gate electrodes overlapping the drain region of the semiconductor layer in a plan view.

The method may further include forming an interlayer insulating layer on the plurality of dummy gate electrodes and the gate electrode, positioning a mask on the interlayer insulating layer, and simultaneously forming a first opening, a second opening, and a third opening through the interlayer insulating layer using the mask.

The first opening may overlap the second portion of the light blocking layer in a plan view, and the dummy gate electrode of the plurality of dummy gate electrodes may be positioned on a side surface of the first opening.

The second opening may overlap the source region of the semiconductor layer in a plan view, and the dummy gate insulating layer and the dummy gate electrode of the plurality of dummy gate electrodes may be positioned on a side surface of the second opening.

The third opening may overlap the drain region of the semiconductor layer in a plan view, and the dummy gate insulating layer and the dummy gate electrode of the plurality of dummy gate electrodes may be positioned on a side surface of the third opening.

The method may further include forming a source electrode and a drain electrode on the interlayer insulating layer may be further included. The source electrode may be in contact with the light blocking layer through the first opening, and in contact with the source region of the semiconductor layer through the second opening.

The drain electrode may be in contact with the drain region of the semiconductor layer through the third opening.

An uppermost surface of the buffer layer positioned over the second portion of the light blocking layer may be positioned further from the substrate than an uppermost surface of the semiconductor layer.

The semiconductor layer may overlap the first portion of the light blocking layer in a plan view.

According to embodiments, the method of manufacturing the display device may simplify the manufacturing process, and the display device may be manufactured in the simplified manufacturing process.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
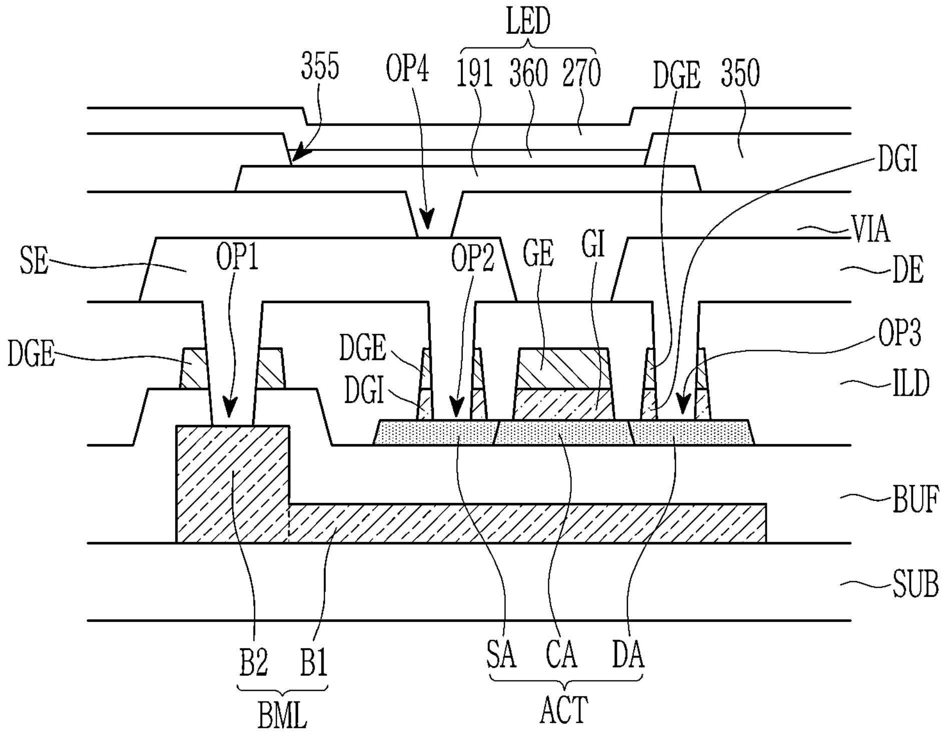
FIG. 1 is a schematic cross-sectional view showing a display device according to the embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, such as "a" and "an," are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Further, in the specification, the phrase "on a plane" or "in a plan view" means when an object portion is viewed from above, and the phrase "on a cross-section" or "in a cross-sectional view" means when a cross-section taken by vertically cutting an object portion is viewed from the side.

Hereinafter, a display device and a method of manufacturing the display device according to an embodiment of the disclosure are described in detail with reference to accompanying drawings.

FIG. 1 is a schematic cross-sectional view showing a display device according to the embodiment. For convenience of explanation, FIG. 1 simply shows a part of the cross-section, however, the disclosure is not limited thereto.

Referring to FIG. 1, a substrate SUB may be prepared. The substrate SUB may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate capable of bending, folding, rolling, etc. The substrate 110 may be single-layered or multi-layered. The substrate 110 may have at least one base layer including sequentially stacked polymer resin and at least one inorganic layer. The at least one base layer and the at least one inorganic layer of the substrate 110 may be alternately stacked each other.

A light blocking layer BML may be positioned on the substrate SUB. The light blocking layer BML may include at least one of aluminum (Al), silver (Ag), magnesium (Mg), gold (Au), nickel (Ni), chromium (Cr), calcium (Ca), molybdenum (Mo), titanium (Ti), tungsten (W), copper (Cu), and a metal oxide thereof. The light blocking layer BML may have a single-layered or multi-layered structure including the above-described material.

The light blocking layer BML may include a first portion B1 and a second portion B2 having different thicknesses. A thickness of the second portion B2 may be greater than a thickness of the first portion B1. The first portion B1 may overlap a semiconductor layer ACT in a plan view, and the second portion B2 may overlap a source electrode SE in a plan view.

As shown in FIG. 1, the uppermost surface of a buffer layer BUF positioned on the second portion B2 of the light blocking layer BML may be positioned farther (or protrude) from the substrate SUB than the uppermost surface of the semiconductor layer ACT. For example, a step may be positioned between the buffer layer BUF positioned on the second portion B2 of the light blocking layer BML and the semiconductor layer ACT. The step may be used to remove a protruded portion of a gate insulating layer GI during the manufacturing process. Detailed description of the step is provided below.

The buffer layer BUF may be positioned on the light blocking layer BML. The buffer layer BUF may include at least one of a silicon oxide ($SiO_x$), a silicon nitride ($SiN_x$), a silicon oxynitride ($SiO_xN_y$), and amorphous silicon (Si).

The buffer layer BUF may include a first opening OP1 overlapping the light blocking layer BML in a plan view. In the first opening OP1, the source electrode SE may be electrically connected to the light blocking layer BML.

The semiconductor layer ACT may be positioned on the buffer layer BUF. The semiconductor layer ACT may include an oxide semiconductor. The oxide semiconductor of the semiconductor layer ACT may include at least one of indium (In), tin (Sn), zinc (Zn), hafnium (Hf), and aluminum (Al). For example, the semiconductor layer ACT may include Indium-Gallium-Zinc Oxide (IGZO).

The semiconductor layer ACT may include a channel area CA, a source area SA, and a drain area DA. The channel area CA may overlap the gate electrode GE in a plan view. The source area SA and the drain area DA may be positioned on sides (e.g., both sides) of the channel area CA.

A gate insulating layer GI may be positioned on the semiconductor layer ACT. The gate insulating layer GI may include at least one of a silicon oxide (SiOx), a silicon nitride (SiNx), and a silicon oxynitride (SiOxNy), and may have a single-layered or multi-layered structure including the above-described material. The gate insulating layer GI may overlap the channel area CA of the semiconductor layer ACT in a plan view.

A gate conductive layer including the gate electrode GE may be positioned on the gate insulating layer GI. The gate conductive layer may include at least one of molybdenum (Mo), aluminum (Al), copper (Cu), titanium (Ti), and a metal oxide thereof, and may have a single-layered or multi-layered structure including the above-described material.

The gate electrode GE and the gate insulating layer GI may be formed in a same process and may have a same planar shape. The gate electrode GE may overlap the semiconductor layer ACT in the direction perpendicular to the substrate SUB (or in a plan view).

An interlayer insulating layer ILD may be positioned on the semiconductor layer ACT and the gate electrode GE. The interlayer insulating layer ILD may include at least one of a silicon oxide ($SiO_x$), a silicon nitride ($SiN_x$), and a silicon oxynitride ($SiO_xN_y$), and may have a single-layered or a multi-layered structure. When the interlayer insulating layer ILD has a multi-layered structure including a silicon nitride and a silicon oxide, a layer including the silicon nitride may be positioned closer to the substrate SUB than a layer including the silicon oxide.

The interlayer insulating layer ILD may include the first opening OP1 overlapping the light blocking layer BML in a plan view, a second opening OP2 overlapping the source area SA of the semiconductor layer ACT in a plan view, and a third opening OP3 overlapping the drain area DA in a plan view.

Referring to FIG. 1, a dummy gate electrode DGE may be positioned on a side of the first opening OP1. A dummy gate insulating layer DGI and the dummy gate electrode DGE may be positioned on a side of the second opening OP2 and the third opening OP3. The dummy gate electrode DGE and the dummy gate insulating layer DGI may be formed simultaneously in the process of forming the gate electrode GE and the gate insulating layer GI, and may be structures for simultaneously forming the first opening OP1, the second opening OP2, and the third opening OP3 by using a mask. For example, the dummy gate electrode DGE and the gate electrode GE may be positioned on a same layer, and the dummy gate insulating layer DGI and the gate insulating layer GI may be positioned on a same layer. Detailed description of manufacturing the first opening OP1, the second opening OP2, and the third opening OP3 using the dummy gate electrode DGE and the dummy gate insulating layer DGI is described below. As shown in FIG. 1, the dummy gate insulating layer DGI and the dummy gate electrode DGE may be positioned along the side of each opening (e.g., the first opening OP1, the second opening OP2, and the third opening OP3). The dummy gate insulating layer DGI may not be positioned in the first opening OP1, and only the dummy gate electrode DGE may be positioned in the first opening OP1.

A data conductive layer including the source electrode SE and a drain electrode DE may be positioned on the interlayer insulating layer ILD. The data conductive layer may include at least one of aluminum (Al), silver (Ag), magnesium (Mg), gold (Au), nickel (Ni), chromium (Cr), calcium (Ca), molybdenum (Mo), titanium (Ti), tungsten (W), copper (Cu), and a metal oxide thereof, and may have a single-layered or a multi-layered structure including the above-described material.

The source electrode SE may be in contact with the light blocking layer BML through the first opening OP1, and may be in contact with the source area SA of the semiconductor layer ACT through the second opening OP2. A drain electrode DE may be in contact with the drain area DA of the semiconductor layer ACT through the third opening OP3.

An insulating layer VIA may be positioned on the data conductive layer. The insulating layer VIA may include at least one organic insulating material of a general purpose polymer such as poly(methyl methacrylate) or polystyrene, a polymer derivative having a phenolic group, an acryl-based polymer, an imide polymer, a polyimide, an acryl-based polymer, and a siloxane-based polymer.

The insulating layer VIA may include a fourth opening OP4 overlapping the source electrode SE in a plan view. A first electrode 191 may be positioned on the insulating layer VIA. The first electrode 191 may be in contact with the source electrode SE through the fourth opening OP4. A partition wall 350 (or bank) may be positioned on the insulating layer VIA and the first electrode 191. The partition wall 350 may have an opening 355 that overlaps the first electrode 191 in a plan view. An emission layer 360 may be positioned within the opening 355. A second electrode 270 may be positioned on the partition wall 350 and the emission layer 360. The first electrode 191, the emission layer 360, and the second electrode 270 may constitute a light-emitting device LED.

As described above, in the display device according to the embodiment, the light blocking layer BML may include the first portion B1 and the second portion B2. A thickness of the second portion B2 may be greater than a thickness of the first portion B1. The dummy gate electrode DGE or the dummy gate insulating layer DGI may be positioned on the side of each of the first opening OP1, the second opening OP2, and the third opening OP3. Since the first opening OP1, the second opening OP2, and the third opening OP3 are formed using a same mask, a manufacturing cost of the display device may be decreased. Over-etching of the semiconductor layer ACT during the formation of the first opening OP1, the second opening OP2, and the third opening OP3 may be prevented.

Figure 2:
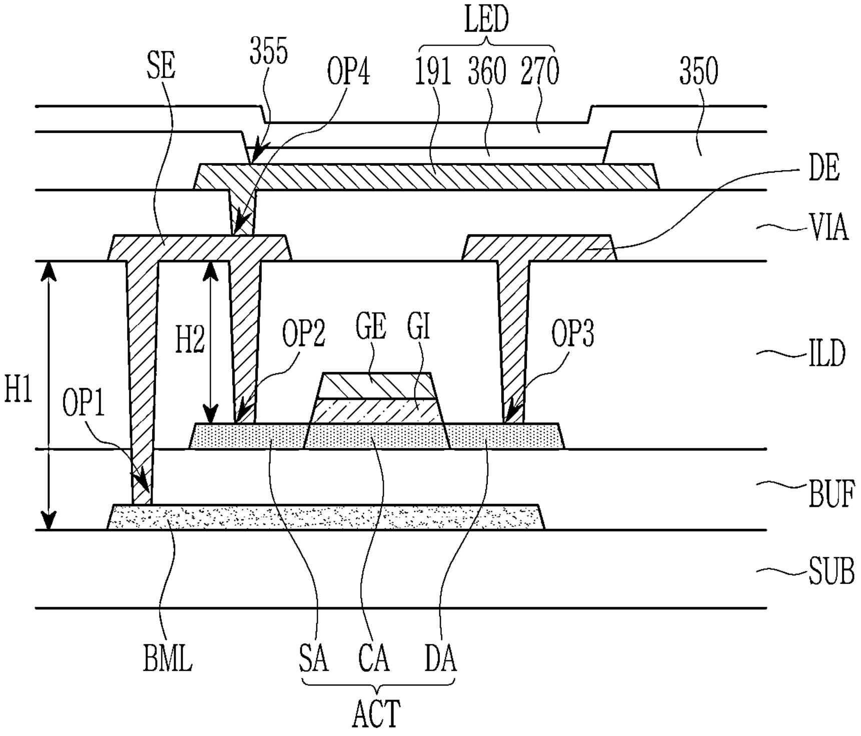
FIG. 2 is a schematic cross-sectional view showing a display device according to another embodiment.

FIG. 2 is a schematic cross-sectional view showing a display device according to another embodiment.

Referring to FIG. 2, a light blocking layer BML may have a same thickness (or a uniform or constant thickness), and a dummy gate electrode DGE or a dummy gate insulating layer DGI may not be positioned on sides of an opening of a first opening OP1, a second opening OP2, and a third opening OP3. Detailed description of the same constituent elements is omitted. In the display device of FIG. 2, when simultaneously forming the first opening OP1, the second opening OP2, and the third opening OP3 by using a same mask, a thickness H1 at which the first opening OP1 is etched may be different from a thickness H2 at which the second opening OP2 and the third opening OP3 are etched, and a semiconductor layer ACT may be over-etched. For example, In FIG. 2, the first opening OP1 may be etched to a first depth H1, and the second opening OP2 and the third opening OP3 may be etched to a second depth H2 smaller than the first depth H1. Since the first depth H1 is greater than the second depth H2, the semiconductor layer ACT overlapping the second opening OP2 and the third opening OP3 in a plan view may be over-etched while the first opening OP1 is etched during the etching process using the mask.

Figure 3:
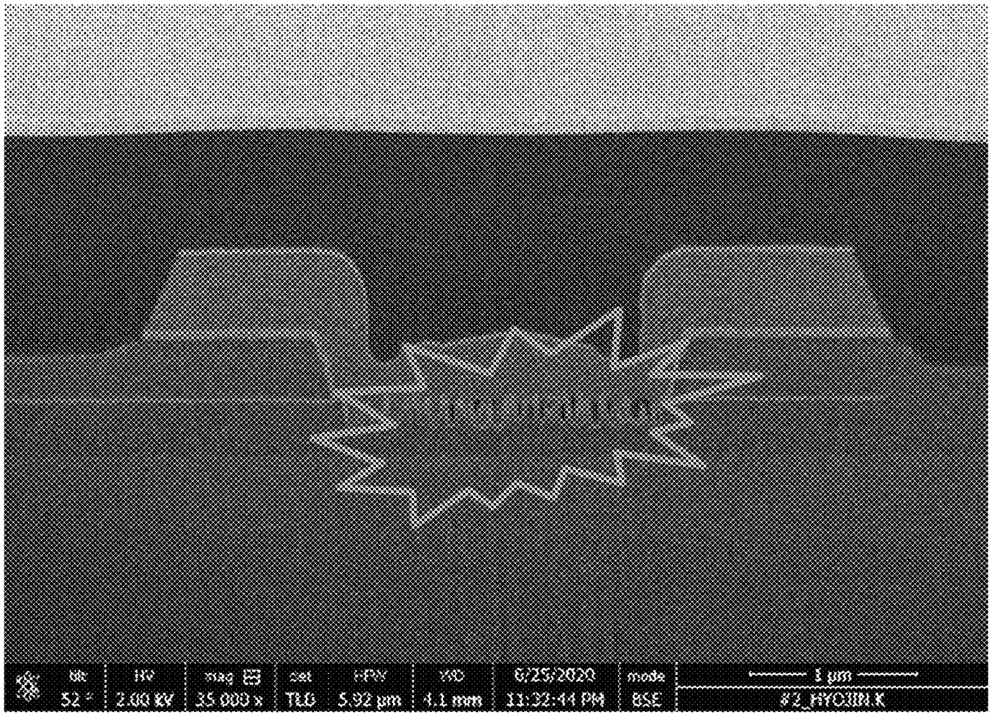
FIG. 3 is a schematic view showing an image of an over-etched semiconductor layer.

FIG. 3 is a schematic view showing an image of an over-etched semiconductor layer. FIG. 3 shows a portion where the semiconductor layer ACT is over-etched. In case that the semiconductor layer ACT is over-etched, the display device may operate abnormally.

However, the display device and the method of manufacturing the display device according to the embodiment may form the step in the light blocking layer BML. Thus, the depths at which the first opening OP1, the second opening OP2, and the third opening OP3 are etched may be similar (or substantially the same). Therefore, the over-etch of the semiconductor layer ACT in the process of forming the first opening OP1, the second opening OP2, and the third opening OP3 with the mask may be prevented. Also, the dummy gate electrode DGE and the dummy gate insulating layer DGI may be positioned on the region at which the first opening OP1, the second opening OP2, and the third opening OP3 are etched. Thus, the etching speed of the openings (e.g., the first opening OP1, the second opening OP2, and the third opening OP3) may be controlled.

Detailed description of the method of manufacturing the display device of the embodiment is provided with reference to accompanying drawings. FIGS. 4 to 19 are schematic views showing a manufacturing process of a display device according to the embodiment.

Figure 4:
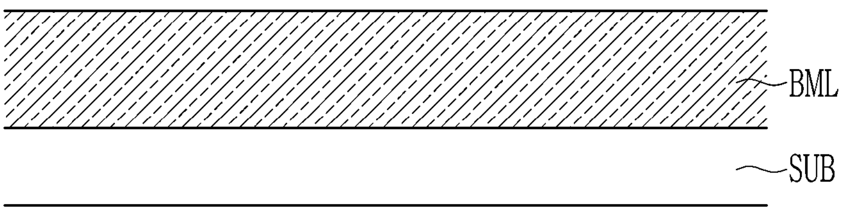
FIGS. 4 to 19 are schematic views showing a manufacturing process of a display device according to the embodiment.

Referring to FIG. 4, a light blocking layer BML (e.g., a layer for forming the light blocking layer BML of FIG. 8) may be formed on a substrate SUB. In FIG. 4, the light blocking layer BML may be formed on a surface (e.g., an entire surface) of the substrate SUB. The light blocking layer BML may include at least of aluminum (Al), silver (Ag), magnesium (Mg), gold (Au), nickel (Ni), chromium (Cr), calcium (Ca), molybdenum (Mo), titanium (Ti), tungsten (W), copper (Cu), and a metal oxide thereof, and may have a single-layered or a multi-layered structure including the above-described material.

Figure 5:
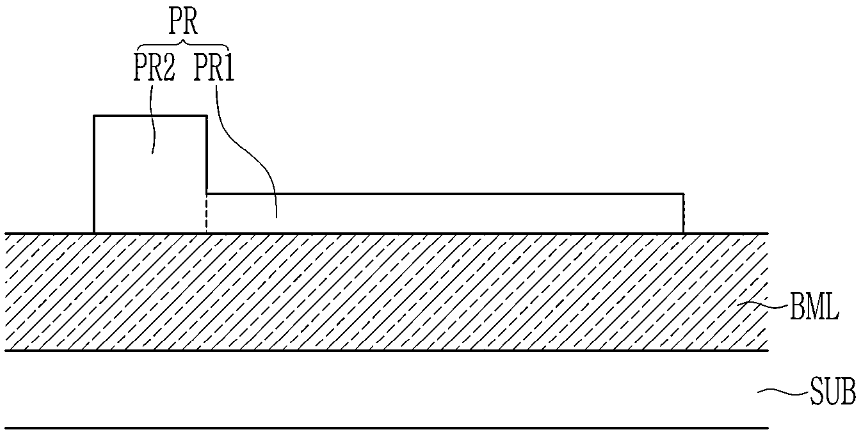
Figure 8:
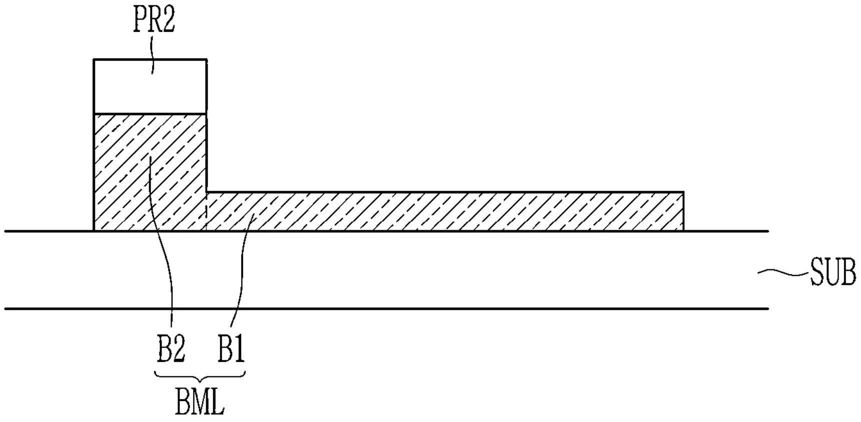

Referring to FIG. 5, a photoresist PR (e.g., a first portion PR1 and a second portion PR2) may be positioned on the light blocking layer BML (e.g., the layer for forming the light blocking layer BML of FIG. 8). The photoresist PR may include a first portion PR1 having a first thickness and a second portion PR2 (e.g., the second portion PR2 to be ashed) having a second thickness that is greater than the first thickness.

Figure 6:
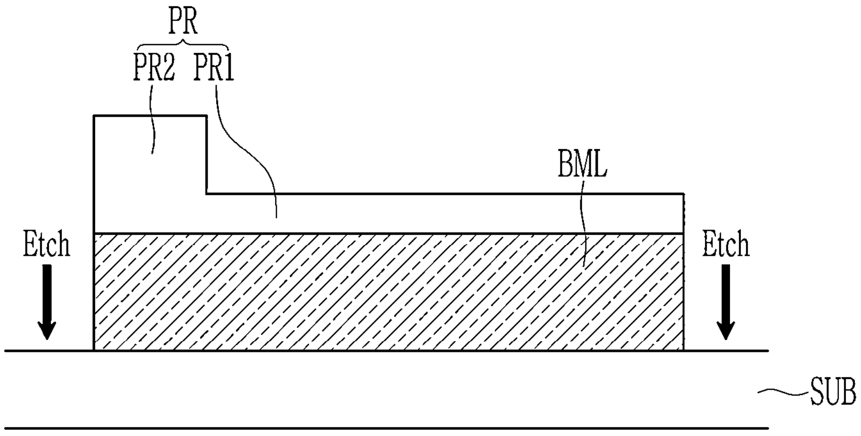

Referring to FIG. 6, the light blocking layer BML (e.g., the layer for forming the light blocking layer BML of FIG. 8) may be etched using the photoresist PR (e.g., the first portion PR1 and a second portion PR2) as an etching mask. In the etching process of FIG. 6, the light blocking layer BML that does not overlap the photoresist PR in a plan view may be removed (e.g., partially removed).

Figure 7:
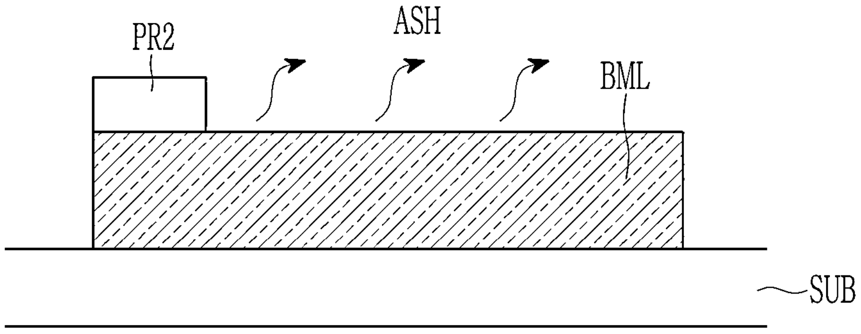

Referring to FIG. 7, the photoresist PR may be ashed. The first portion PR1 of the photoresist PR may be removed by the ashing, and only the second portion PR2 may be left. A thickness of the second portion PR2 may be smaller than a thickness of the second portion PR2 (e.g., the second portion PR2 to be ashed) before the ashing.

Referring to FIG. 8, the light blocking layer BML (e.g., the light blocking layer BML of FIG. 7) may be etched by using the photoresist PR (e.g., the second portion PR2). In the etching process of FIG. 8, the light blocking layer BML (e.g., at least part of the light blocking layer BML) that does not overlap the photoresist PR in a plan view may be removed. The light blocking layer BML including the first portion B1 and the second portion B2 that has a thickness greater than a thickness of the first portion B1 may be formed.

Figure 9:
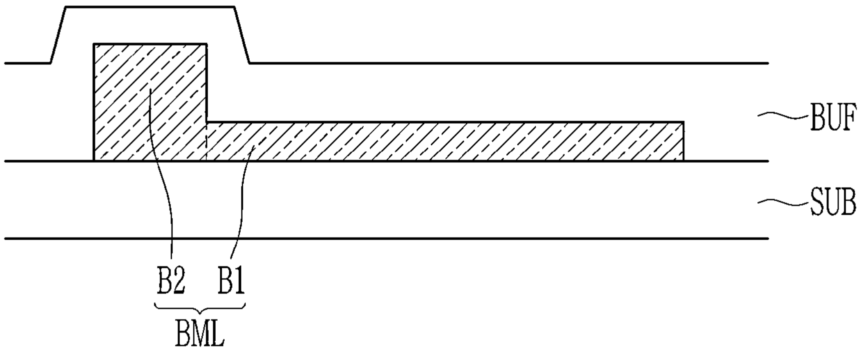

Referring to FIG. 9, a buffer layer BUF may be formed on the light blocking layer BML. The buffer layer BUF may include at least one of a silicon oxide (SiOx), a silicon nitride (SiNx), a silicon oxynitride (SiOxNy), and amorphous silicon (Si). Since the light blocking layer BML includes a protruded portion, the buffer layer BUF may also protrude in the region overlapping the second portion B2 of the light blocking layer BML in a plan view.

Figure 10:
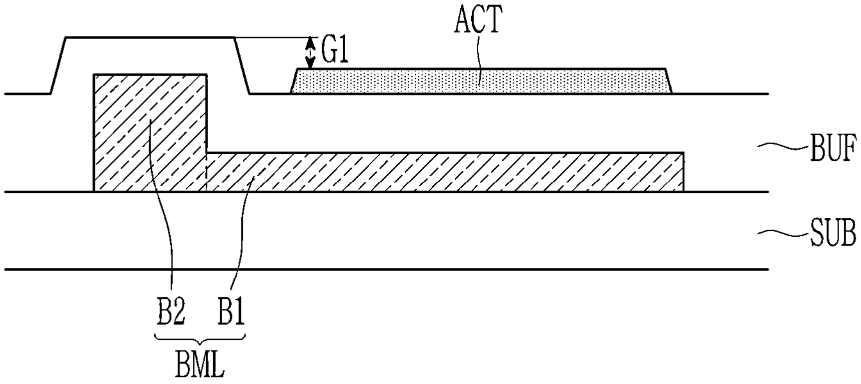

Referring to FIG. 10, a semiconductor layer ACT may be formed on the buffer layer BUF. The semiconductor layer ACT may include an oxide semiconductor. The oxide semiconductor of the semiconductor layer ACT may include at least one of indium (In), tin (Sn), zinc (Zn), hafnium (Hf), and aluminum (Al). For example, the semiconductor layer ACT may include Indium-Gallium-Zinc Oxide (IGZO). The semiconductor layer ACT may overlap the first portion B1 of the light blocking layer BML in a plan view. The semiconductor layer ACT may not overlap the second portion B2 of the light blocking layer BML in a plan view.

In FIG. 10, the uppermost surface of the buffer layer BUF positioned on the second portion B2 of the light blocking layer BML may be positioned farther (or protrude) from the substrate SUB than the uppermost surface of the semiconductor layer ACT. For example, the step G1 may be positioned between the buffer layer BUF positioned on the second portion B2 of the light blocking layer BML and the semiconductor layer ACT.

Figure 11:
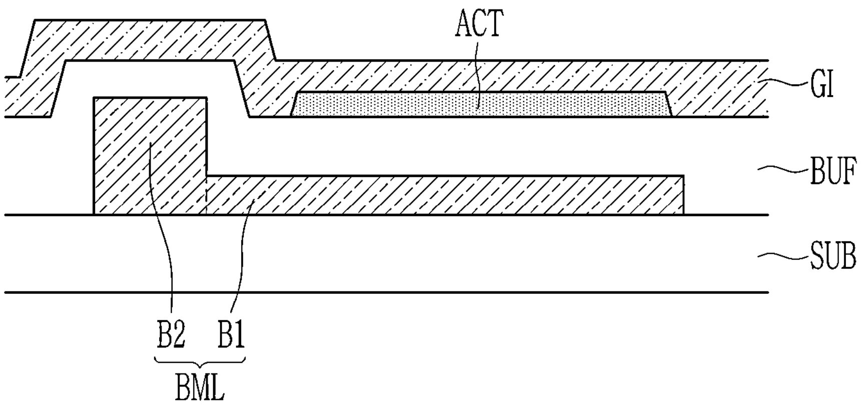

Referring to FIG. 11, a gate insulating layer GI may be formed on the buffer layer BUF and the semiconductor layer ACT. The gate insulating layer GI may include at least one of a silicon oxide ($SiO_x$), a silicon nitride ($SiN_x$), and a silicon oxynitride ($SiO_xN_y$), and may have a single-layered or a multi-layered structure including the above-described material. Since the light blocking layer BML includes a protruded portion (e.g., the second portion B2), the buffer layer BUF may also protrude in the region overlapping the second portion B2 of the light blocking layer BML in a plan view, and the gate insulating layer GI may also protrude in the region overlapping the second portion B2 of the light blocking layer BML in a plan view.

Figure 12:
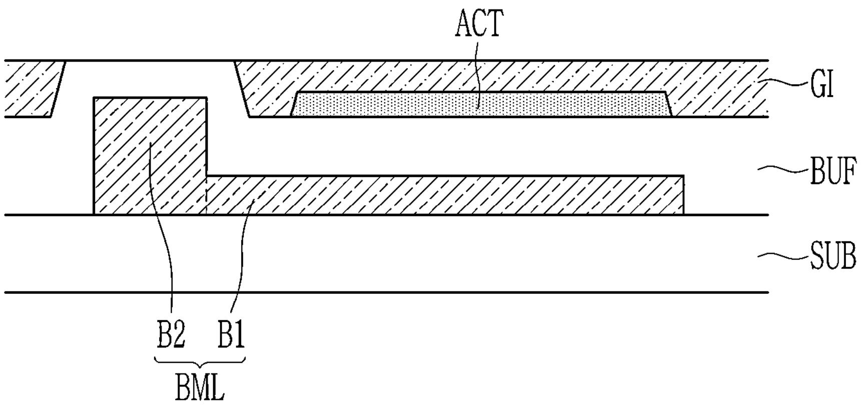

Referring to FIG. 12, the protruded portion of the gate insulating layer GI may be removed. The removal of the protruded portion of the gate insulating layer GI may be performed through a chemical mechanical polishing (CMP)

process or the like. In FIG. 12, the gate insulating layer GI (e.g., at least part of the gate insulating layer GI) positioned on the protruded buffer layer BUF may be removed. Through the process of FIG. 12, the upper surface of the display device being manufactured may be flat.

Figure 13:
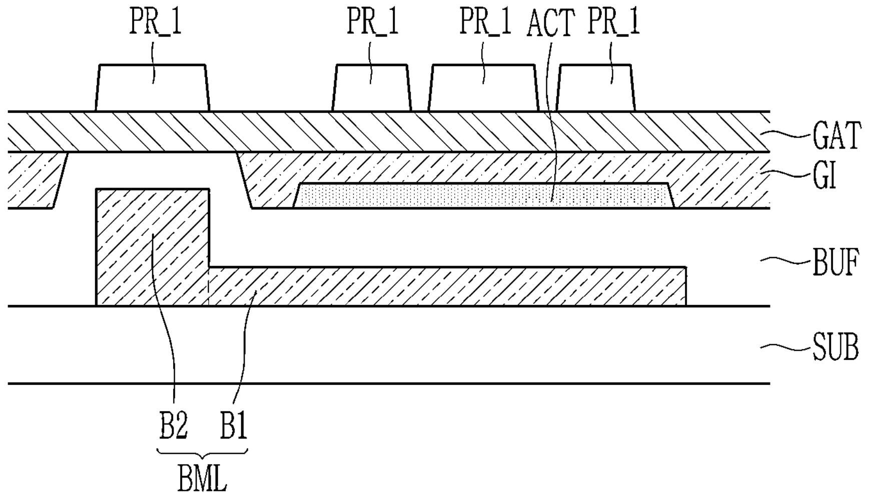

Referring to FIG. 13, a gate conductive layer GAT may be formed on the buffer layer BUF and the gate insulating layer GI. The gate conductive layer GAT may include at least one of molybdenum (Mo), aluminum (Al), copper (Cu), titanium (Ti), and a metal oxide thereof, and may have a single-layered or a multi-layered structure including the above-described material. The gate conductive layer GAT may be formed on a surface (e.g., the entire surface) of the display device. Also, a photoresist PR_1 may be positioned on the gate conductive layer GAT. The photoresist PR may include multiple spaced regions between the patterns of the photoresist PR_1.

Figure 14:
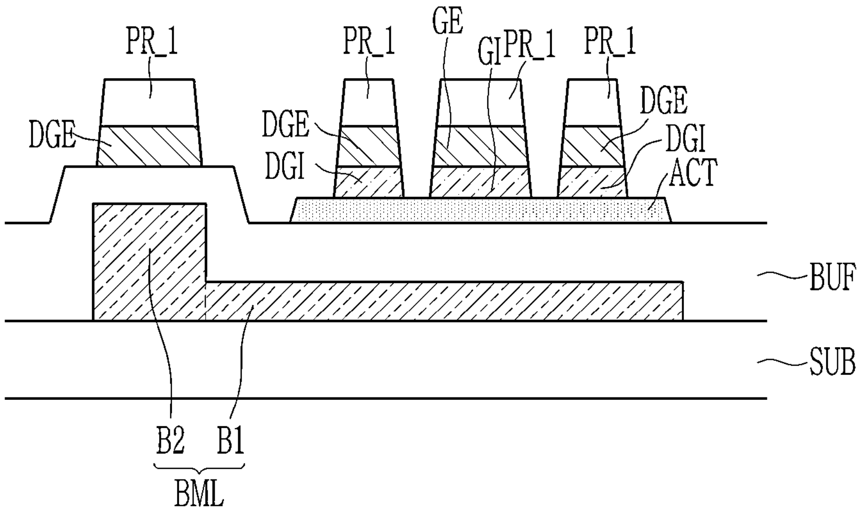

Referring to FIG. 14, the gate conductive layer GAT and the gate insulating layer GI may be etched by using the photoresist PR_1. In the etching process of FIG. 14, the gate conductive layer GAT and the gate insulating layer GI that do not overlap the photoresist PR_1 in a plan view may be removed. Thus, a dummy gate electrode DGE, a dummy gate insulating layer DGI, a gate electrode GE, and a gate insulating layer GI may be formed by the process of FIG. 14. Referring to 14, the dummy gate electrode DGE may be formed overlapping the second portion B2 of the light blocking layer BML in a plan view. Also, the gate insulating layer GI and the gate electrode GE may be formed overlapping a channel region (not shown) of the semiconductor layer ACT in a plan view. The dummy gate insulating layer DGI and the dummy gate electrode DGE may be formed overlapping a source region (not shown) and a drain region (not shown) of the semiconductor layer ACT in a plan view.

Figure 15:
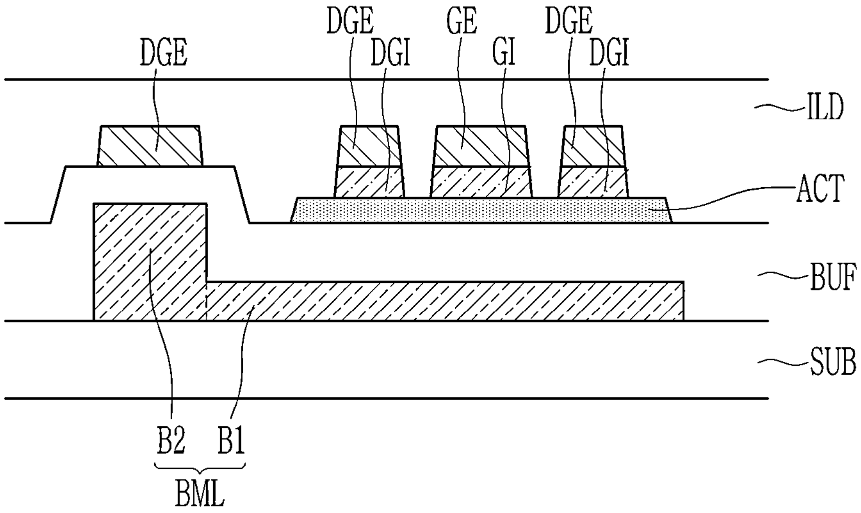

Referring to FIG. 15, the photoresist PR_1 may be removed and an interlayer insulating layer ILD may be formed. The interlayer insulating layer ILD may include at least one of a silicon oxide ($SiO_x$), a silicon nitride ($SiN_x$), and a silicon oxynitride ($SiO_xN_y$), and may have a single-layered or a multi-layered structure including the above-described material. The interlayer insulating layer ILD may be formed and fill the region between the dummy gate electrode DGE and the gate electrode GE that are spaced apart from each other.

Figure 16:
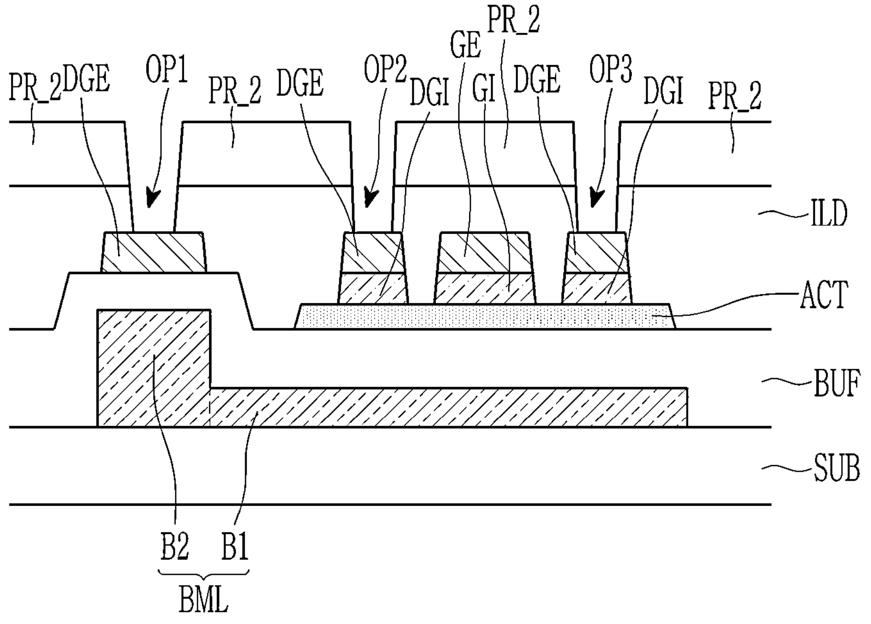

Referring to FIG. 16, a photoresist PR_2 may be positioned on the interlayer insulating layer ILD. The photoresist PR_2 may include openings corresponding to a first opening OP1, a second opening OP2, and a third opening OP3. Referring to FIG. 16, the interlayer insulating layer ILD may be etched using the photoresist PR_2. In the etching process of FIG. 16, the interlayer insulating layer ILD that does not overlap the photoresist PR_2 in a plan view may be removed. Referring to FIG. 16, the first opening OP1, the second opening OP2, and the third opening OP3 may be formed in the interlayer insulating layer ILD. As shown in FIG. 16, a thickness of the interlayer insulating layer ILD positioned on the gate electrode GE and a thickness of the interlayer insulating layer ILD positioned on the dummy gate electrode DGE may be similar. Accordingly, the etching of the first opening OP1, the second opening OP2, and the third opening OP3 may be completed simultaneously.

Figure 17:
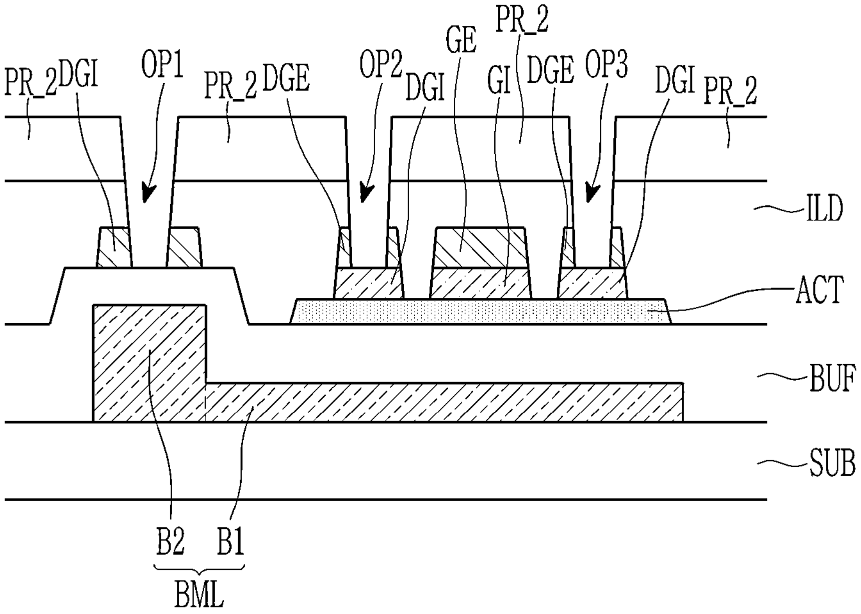

Referring to FIG. 17, the dummy gate electrode DGE may be etched. For example, the dummy gate electrode DGE may be continuously etched. Since the dummy gate insulating layer DGI is not positioned on the second portion B2 of the light blocking layer BML, the buffer layer BUF may be exposed by the etching. The dummy gate insulating layer DGI may be positioned on the first portion B1 of the light blocking layer BML, and the dummy gate insulating layer DGI may be exposed by the etching of the dummy gate electrode DGE.

Figure 18:
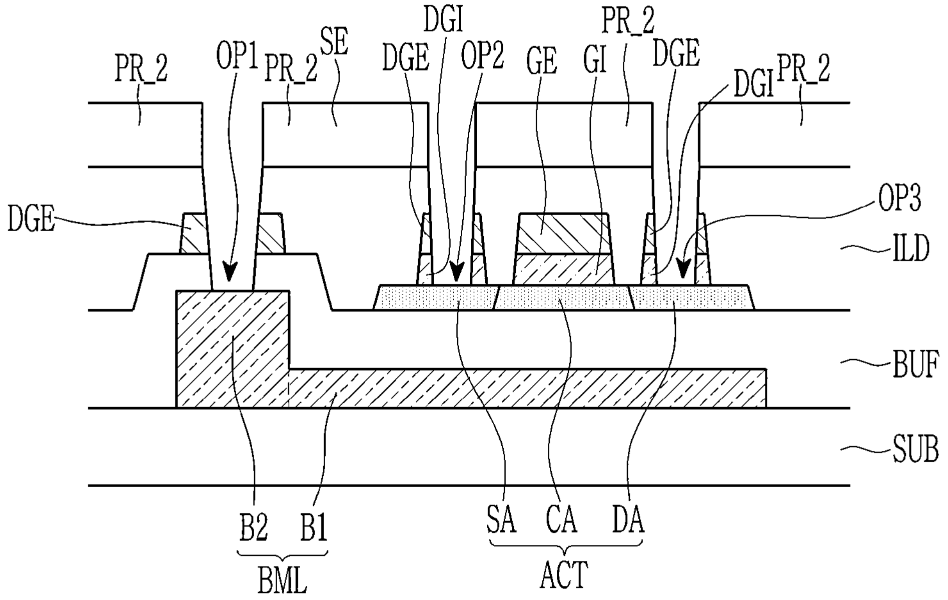

Referring to FIG. 18, the buffer layer BUF and the dummy gate insulating layer DGI may be etched. For example, the buffer layer BUF and the dummy gate insulating layer DGI may be continuously etched.

As shown in FIG. 18, the buffer layer BUF may be etched in the first opening OP1, and the dummy gate insulating layer DGI may be etched in the second opening OP2 and the third opening OP3. A time required for etching the buffer layer BUF in the first opening OP1 and a time required for the etching of the dummy gate insulating layer DGI in the second opening OP2 and the third opening OP3 may be similar (or substantially the same). Accordingly, the etching of the first opening OP1, the second opening OP2, and the third opening OP3 may be simultaneously completed.

In the method of manufacturing the display device according to the embodiment, the first opening OP1, the second opening OP2, and the third opening OP3 may be simultaneously formed by using the mask (e.g., the single mask), and the over-etching due to the differences in the etching thickness and speed may be prevented.

The source area SA and the drain area DA may be formed by doping the semiconductor layer ACT through the second opening OP2 and the third opening OP3. A channel area CA may be formed between the source area SA and the drain area DA.

Figure 19:
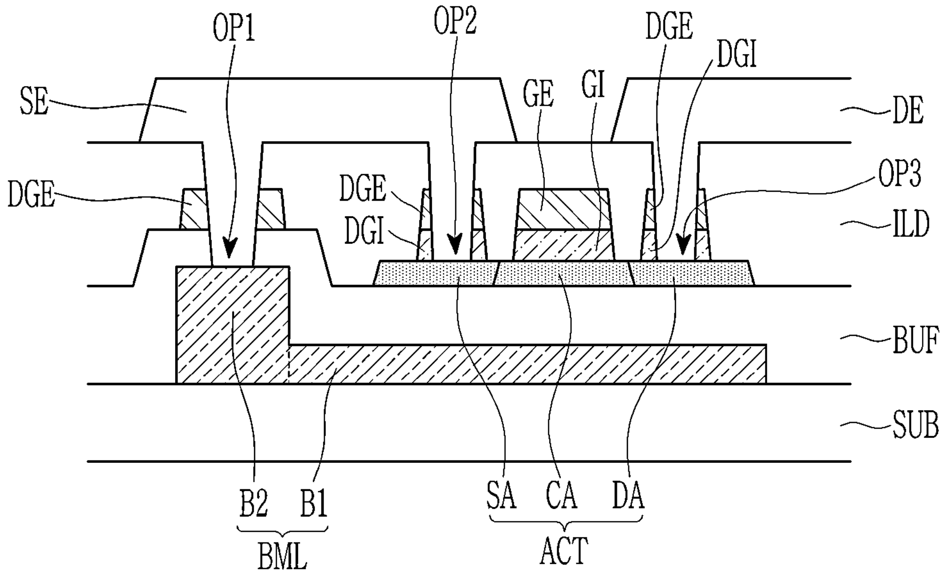

Referring to FIG. 19, a source electrode SE and a drain electrode DE may be formed. The source electrode SE may be in contact with the light blocking layer BML through the first opening OP1, and may come into contact with the source area SA of the semiconductor layer ACT through the second opening OP2. Also, the drain electrode DE may be in contact with the drain area DA of the semiconductor layer ACT through the third opening OP3.

As described above, in the method of manufacturing the display device according to the embodiment, the light blocking layer BML may include the first portion B1 and the second portion B2. A thickness of the second portion B2 may be greater than a thickness of the first portion B1. Accordingly, since the thicknesses of the interlayer insulating layer ILD etched when forming the first opening OP1, the second opening OP2, and the third opening OP3 are similar (or substantially the same), the first opening OP1, the second opening OP2, and the third opening OP3 may be formed without an over-etched portion. For example, since the etched thickness of the interlayer insulating layer ILD for forming the first opening OP1, the etched thickness of the interlayer insulating layer ILD for forming the second opening OP2, and the etched thickness of the interlayer insulating layer ILD for forming the third opening OP3 may be substantially the same, the over-etch of the semiconductor layer ACT may be prevented.

The dummy gate electrode DGE and the dummy gate insulating layer DGI may be positioned in the region at which the first opening OP1, the second opening OP2, and the third opening OP3 are formed. The dummy gate electrode DGE and the dummy gate insulating layer DGI may act as an etch stopper during the etching process, and in the process of forming the first opening OP1, the second opening OP2, and the third opening OP3, each opening (e.g., the first opening OP1, the second opening OP2, and the third opening OP3 may be simultaneously formed. Thus, the damage of the semiconductor layer ACT may be prevented during the etching process.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a light blocking layer positioned on a substrate and including:

a first portion; and a second portion having a thickness greater than a thickness of the first portion, wherein the light blocking layer is a single, uninterrupted structure where the first portion directly contacts the second portion;

a buffer layer positioned above the light blocking layer;

a semiconductor layer positioned over the buffer layer and including:

a source region;

a channel region; and a drain region;

a gate insulating layer positioned over the semiconductor layer;

a gate electrode positioned over the gate insulating layer;

an interlayer insulating layer positioned over the gate electrode, and including:

a first opening overlapping the second portion of the light blocking layer in a plan view, and a second opening overlapping the source region of the semiconductor layer in a plan view; and a dummy gate electrode positioned on a side surface of the first opening.

2. The display device of claim 1, further comprising:

a dummy gate insulating layer positioned on a side surface of the second opening;

a dummy gate electrode positioned on the side surface of the second opening, and the dummy gate electrode overlapping the second portion of the light blocking layer in the plan view.

3. The display device of claim 2, wherein the interlayer insulating layer further includes a third opening overlapping the drain region of the semiconductor layer in a plan view, and the display device further comprises:

a dummy gate insulating layer positioned on a side surface of the third opening; and a dummy gate electrode positioned on the side surface of the third opening.

4. The display device of claim 3, wherein the dummy gate electrodes and the gate electrode are positioned on a same layer, and the dummy gate insulating layers and the gate insulating layer are positioned on a same layer.

5. The display device of claim 1, wherein:

the semiconductor layer overlaps the first portion of the light blocking layer in a plan view, and the first portion and the second portion of the light blocking layer are formed from a same layer and from a same material and directly contact each other.

6. The display device of claim 1, wherein;

the second portion of the light blocking layer does not overlap the gate insulating layer or a dummy gate insulating layer in a plan view, and a depth of the second opening and a depth of the first opening are substantially equal.

7. The display device of claim 1, further comprising:

a source electrode positioned on the interlayer insulating layer and filling each of the first opening and the second opening; and a drain electrode positioned on the interlayer insulating layer, wherein the source electrode is in contact with the light blocking layer through the first opening, and in contact with the source region of the semiconductor layer through the second opening.

8. The display device of claim 7, wherein;

the drain electrode is in contact with the drain region of the semiconductor layer through a third opening, and a depth of the first opening, a depth of the second opening, and a depth of the third opening are substantially equal.

9. A display device comprising:

a light blocking layer positioned on a substrate and including:

a first portion; and a second portion having a thickness greater than a thickness of the first portion;

a buffer layer positioned above the light blocking layer;

a semiconductor layer positioned over the buffer layer and including:

a source region;

a channel region; and a drain region;

a gate insulating layer positioned over the semiconductor layer;

a gate electrode positioned over the gate insulating layer;

an interlayer insulating layer positioned over the gate electrode, and including:

a first opening overlapping the second portion of the light blocking layer in a plan view; and a second opening overlapping the source region of the semiconductor layer in a plan view; and a dummy gate electrode positioned on a side surface of the first opening, wherein an uppermost surface of the buffer layer positioned over the second portion of the light blocking layer is positioned further from the substrate than an uppermost surface of the semiconductor layer.

* * * * *